United States Patent [19]

Street et al.

[11] Patent Number: 5,017,989

[45] Date of Patent: May 21, 1991

[54] SOLID STATE RADIATION SENSOR ARRAY PANEL

[75] Inventors: Robert A. Street, Palo Alto; Benjamin Kazan, Los Altos, both of Calif.

[73] Assignee: Xerox Corporation, Stamford, Conn.

[21] Appl. No.: 447,302

[22] Filed: Dec. 6, 1989

[51] Int. Cl.[5] .................... H01L 27/14; H01L 31/00; H01L 27/01; H01L 27/13
[52] U.S. Cl. .................................. 357/30; 357/23.7; 357/32
[58] Field of Search ................... 357/23.7, 32, 30 H, 357/30 R

[56] References Cited

U.S. PATENT DOCUMENTS

| | | | |
|---|---|---|---|
| 4,028,565 | 6/1977 | Davis | 357/26 |
| 4,381,517 | 4/1983 | Harada | 357/31 |
| 4,463,279 | 7/1984 | Shidara et al. | 357/32 |
| 4,633,092 | 12/1986 | Statt et al. | 357/30 H |
| 4,701,394 | 10/1987 | Inoue et al. | 357/2 |
| 4,736,229 | 4/1988 | Holmberg et al. | 357/54 |
| 4,740,824 | 4/1988 | Yano et al. | 357/30 H |
| 4,845,355 | 7/1989 | Nakagawa et al. | 357/30 |
| 4,857,981 | 8/1989 | Matsumoto et al. | 357/30 H |

FOREIGN PATENT DOCUMENTS 0066767 12/1982 European Pat. Off. .......... 357/30 H

OTHER PUBLICATIONS

Gordon Kramer, "TFT Switching Matrix for Hat-Panel Displays.", 1975, pp. 152-158 of Proceeding of the S.I.D.

Primary Examiner—Andrew J. James
Assistant Examiner—Daniel Kim
Attorney, Agent, or Firm—Serge Abend

[57] ABSTRACT

A solid state radiation sensor array panel comprising a thick deposited radiation detector layer capable of generating electron-hole pairs in response to being irradiated, and a matrix array of transistors comprising source and drain electrode elements, a charge transport layer, and a dielectric layer disposed over one surface of the detector layer. Means is provided for establishing an electric field across the detector layer, which field is collapsible to establish a higher field in irradiated areas so as to establish a current path, between the source and drain electrode elements, through pixel areas of the charge transport layer. The currents passing through pixel areas are passed to a readout circuit for processing the radiation image information.

17 Claims, 5 Drawing Sheets

SOLID STATE RADIATION SENSOR ARRAY PANEL

FIELD OF THE INVENTION

This invention relates to a large area sensor array panel for direct detection of image-wise radiation patterns and the pixel-by-pixel electronic read-out thereof. For example, the sensor array panel is capable of providing electrical image information representative of input patterns of visible or UV light, X-ray, gamma rays, high energy ionizing particles and even sound waves.

BACKGROUND OF THE INVENTION

Sensor arrays are commonly used for diagnostic imaging, in medical and scientific applications. Conventionally these have outputs which may be visual, resulting in a film image, or digital, resulting in electrical data for transmission to a suitable data processing unit. In order to be useful, good spatial and energy resolutions are required, i.e. the number of pixels per unit area resolved and the sensitivity to the expected energy spectrum, must be coincident with the task requirements.

A 1-D digital detector array is taught in U.S. Pat. No. 4,303,860 (Bjorkholm et al), wherein a narrow fan beam of X-rays is passed through an object to be imaged and is received by a scintillation crystal which generates light, in proportion thereto. The light, in turn, is received by an array of photodiodes, in itimate contact with the crystal, which generate a current in proportion to the intensity of illumination. The current may be detected by any suitable means, such as an array of CCDs or other sensor. Relative movement between the object and the radiation source with its detector array is required in order to completely image the object.

By using a two-dimensional detector array, a single divergent X-ray beam may be directed through an object onto a large area panel, which may be of any arbitrary size. In U.S. Pat. No. 4,626,688 (Barnes) FIGS. 1 and 2 of U.S. Pat. No. 4,707,608 (DiBianca) both one-dimensional and two-dimensional arrays are shown. As in Bjorkholm et al, Barnes discloses a radiation sensitive material responsive to incident radiation to produce light and an adjacent array of photodiodes responsive to the light to produce an analog electrical signal indicative of radiation intensity. In DiBianca primary radiation (X-rays) produces secondary radiation (electron-ion pairs) within a detector which, in turn, produces charge carries in a detector.

Recent progress in amorphous silicon fabrication techniques has enabled this material to be deposited and patterned over large areas so as to create page size integrated electronics. Typically, for most electronic applications, as well as for optical sensing applications, this material is no more than a few microns thick. When used with a radiation detecting phosphor screen, X-rays impacting the phosphor cause it to emit visible light which will generate a current normally through the adjacent amorphous silicon detector layer which, in turn, must be picked up by a suitable detection circuit. A major shortcoming of devices of this type is their extremely low detection efficiency. Because the phosphor screen typically has an efficiency generally below 10% in generating light in response to incident radiation, even with a highly efficient optical sensor coupled thereto, devices of this type can be no more than about 10% efficient.

While thin amorphous silicon layers are highly efficient in detecting visible light, it is known that thick amorphous silicon layers (on the order of 10 to 50 $\mu$m) may detect high energy radiation (i.e. radiation with high energy photons or particles) with an efficiency of greater than 90%. In U.S. Pat. No. 4,785,186 (Street et al) a thick amorphous silicon layer in a p-i-n doped configuration with electrically biased upper and lower metal electrodes will pass current therethrough, thereby detecting the existence of high energy radiation. Particle position detection can be accomplished by an array of such devices connecting the output currents to the input of amplifiers. The direct detection of radiation induced electron-hole pairs passing through the detector layer is much simpler than the arrangement afforded by scintillation systems in which the high energy radiation is converted to visible light which is detected by an adjacent sensor.

In a paper entitled "A New Type of Field-Effect Image Storage Panel with a Photoconductive Charging Layer" (Kazan et al), Proceedings of the IEEE, Vol. 56, No. 11, pp. 2057-2059, November 1968 there is taught an electroluminescent imaging panel in which local charging or discharging of an adjacent semiconductor layer (ZnO) is controlled by a next adjacent photoconductive layer. Thus, in areas irradiated by an image of UV radiation, the resultant currents through the photoconductive layer produce trapped charges at the interface with a ZnO layer which, in turn, controls the local conductivity of the ZnO layer. In accordance with these variations in conductivity, local currents are allowed to flow through an electroluminescent phosphor across which voltage is maintained. A stored visible image is thus produced by the electroluminescent phosphor layer, corresponding to a transient image.

A transistor-photodiode array with multiplexed scanning is taught in "Advances in Image Pickup and Display", Vol. 6 pp. 184, 185, ©1983, in the chapter entitled "Image Sensors for Television and Related Applications" (Weimer et al). As schematically illustrated in FIG. 4, each pixel location is provided with a photosensor and a transisor.

SUMMARY OF THE INVENTION

None of the above referenced arrangements satisfies the high resolution requirements of present day diagnostic imaging (on the order of several hundred spots per inch) with a relatively inexpensive and simply fabricated structure. Two-demensional sensor arrays are known to have been fabricated incorporating a sensor and a transistor at each pixel location, using known thin-film lithographic techniques. However, in these devices the sensors and transistors lend themselves to fabrication integration because they have generally the same thickness dimensions (i.e. transistors having an overall thickness of about ½ $\mu$m and sensors having an overall thickness dimension of about 1 $\mu$m). It would be virtually impossible to form 2-D sensor arrays integrating at each pixel location very thick detectors (about 20 to greater than 100 $\mu$m) and very thin transistors (about 1 $\mu$m).

We believe that thick films of photoconductive materials, such as amorphous selenium, polycrystalline zinc sulfide, arsenic selenide and other chalcogenide glasses, because of their high atomic mass, would be desirable as X-ray or other high energy particle detectors. Organic photoconductors may also be used to detect high energy radiation but, because of their low atomic mass, may not function as well. However, these materials by and large have no body of photolithographic technology associated with them to allow the producing of a pattern of small elements. If the detector material is a piezoelectric, such as polyvinylidene difluoride, it is possible to detect ultrasound or other pressure waves.

Therefore, it is the primary object of this invention to provide a direct radiation detection and readout device employing a thick radiation detector, which does not need to be patterned, and incorporating therewith a large area thin-film transistor (TFT) array for generating analog electrical outputs signals responsive to the amount of radiation impinging upon each pixel location.

This object may be carried out, in one form, by providing a solid state radiation sensor array panel comprising a thick deposited radiation detector layer capable of generating electron-hole pairs when irradiated, and a matrix array of transistors comprising source and drain electrode elements, a charge transport layer, and a dielectric layer disposed over one surface of the detector layer. Means is provided for establishing an electric field across the detector layer, which field is collapsible in irradiated areas thus establishing a higher field across the dielectric, and allowing current to flow between the source and drain electrode elements, through the charge transport layer in pixel areas. The currents passing through the pixel areas are then passed to a readout circuit for processing the radiation image information.

BRIEF DESCRIPTION OF THE DRAWINGS

Other objects and further features and advantages of this invention will be apparent from the following, more particular, description considered together with the accompanying drawings, wherein.

DETAILED DESCRIPTION OF THE ILLUSTRATED EMBODIMENTS

Figure 1:
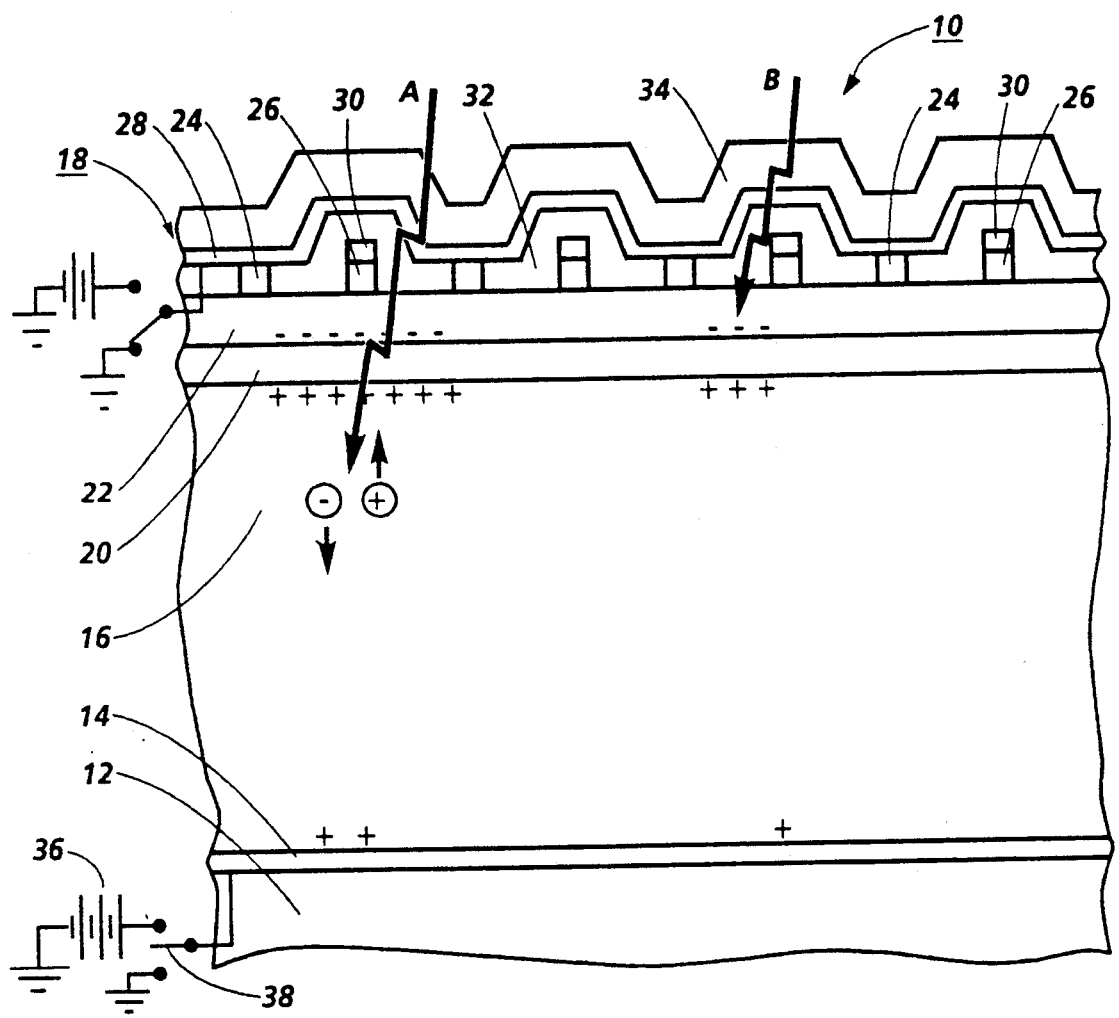
FIG. 1 is a side sectional view taken through the solid state image sensor array of the present invention.

Turning now to FIG. 1 there is illustrated a large area image sensor panel 10 which can be used for any radiation that results in the excitation of electron-hole pairs, such as X-rays, gamma rays, or high energy ionizing particles. The panel may be fabricated in any suitable size, such as would be required for medical or other diagnostic imaging. It includes a substrate 12, such as glass, which must be able to withstand the fabrication temperatures of the layers to be deposited thereon (on the order of 300° C.), upon which is deposited a thin (about 500 Å thick), continuous, planar, conductive layer 14, such as chromium or aluminium. If the detector panel is used in a manner in which the radiation must pass through the conductive layer, the conductive layer must be made of a material which will allow such passage. The next adjacent layer is a thick, continuous, planar, detector layer 16, which can be any semiconducting material having an appropriate absorption coefficient and thickness for the type of radiation to be sensed and which will generate electron-hole pairs in response to the radiation. For high energy radiation, a material with a high atomic number is most suitable. Presently, amorphous silicon thick films have a practical fabrication limit of about 50 μm, while the practical thickness limitation for chalcogenide glasses may be about 100 to 200 μm.

Grown directly upon the detector layer is a multilayer matrix array 18 of thin film transitors comprising: a thin (about 3000 Å thick), continuous, planar, gate dielectric layer 20, typically made of silicon nitride; an undoped, or very lightly doped, thin (about 1000 to 3000 Å thick), continuous, planar, semiconductor channel layer 22 typically made of amorphous silicon; a patterned array of generally orthogonal n+ source electrodes 24 and n+ drain electrodes 26 (about 200 to 500 Å thick) each being provided with metal contact lines 28 and 30, of comparable thickness, thereon; and a silicon nitride insulation layer 32 (about 3000 Å thick) located between the source and drain electrodes and overlying the drain metal contact line 30, protects the crossovers from shorting. A final passivating insulating layer 34 (about 100 to 3000 Å thick), such as polyimide or silicon nitride, protects the device.

Figure 2:
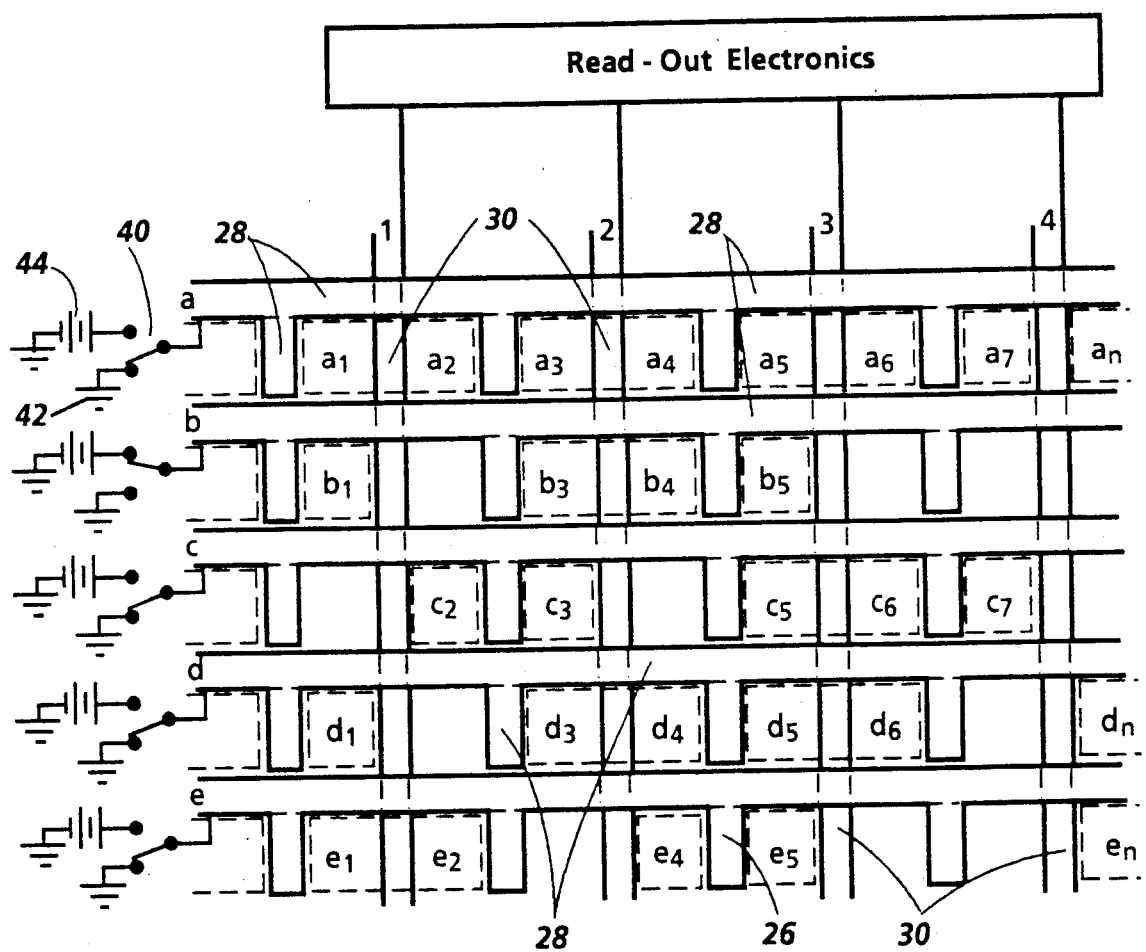
FIG. 2 is a top plan view of the sensor array of FIG. 1, with the passivation layer having been removed, showing the readout matrix of thin film transistors.

As illustrated in FIG. 2, the source metal contact lines 28 extend generally horizontally and overlie and interconnect the source electrode segments 24 (shown in FIG. 1) in a comb-like structure, wherein the segments are the teeth of the comb. These source electrode segments 24 are vertically arranged in columns and, together with intermediate vertical stripes of the drain electrodes, define the individual pixels of the panel $a_1$ to $a_n$ through $e_1$ to $e_n$ (each represented as a broken line rectangle). Spacing of the source and drain elements will determine the desired resolution of the array as dictated by its use. For many diagnostic applications high resolution, such as 300 spots per inch or greater may be desirable, while for therapy applications 100 spots per inch may be perfectly adequate. It should be noted that a single pixel may be defined as extending from a single source electrode segment to the next adjacent drain electrode line or may be defined as extending from one source electrode segment to the next horizontally adjacent source electrode segment, in which case each source electrode segment passes current to the intermediate drain electrode line.

In the fabrication of our sensor array panel, most of the layers require only direct planar deposition upon the substrate with no subsequent patterning. This results in an extremely simple and inexpensive construction. The only patterning required is to form the thin film transistor array. Typical patterning steps would be:

(a) depositing an n+ layer;
(b) patterning and etching the n+ layer so as to form the source electrode segments 24 and the drain electrode stripes 26;
(c) depositing a drain metal layer;
(d) patterning and etching the drain metal lines 30 so that they overlie the drain electrode stripes 26;
(e) depositing a nitride insulation layer 32;
(f) patterning and etching the insulation layer so as to expose the source electrode segments while burying the drain electrode and its metallization
(g) depositing the source metal layer;

(h) patterning and etching the source metal lines 28 so that portions thereof overlie the source electrode segments; and (i) depositing the top nitride insulation layer 34.

Although the illustration in FIG. 1 is not to scale it should be noted that the cumulative thickness of the several layers comprising the thin film transistors 18 is about 1 μm, or less, whereas the detector layer 16 itself may be deposited to a thickness as great as 20 μm, or more. Clearly it would be impractical, if not impossible, to define a fabrication process which requires the integration of such a thick detector and such a thin transistor side-by-side at each pixel location.

The conductive layer 14 is selectively coupled to high potential source 36, on the order of 100 volts, or ground, via a switch 38. Each of the drain electrode lines 30 is connected to a suitable readout circuit (not shown) maintained close to ground potential, and each of the source electrode lines 28 is connected via a switch 40 to either a reference potential source 42, such as ground, or to a potential read-out source 44, on the order of 10 volts.

In operation, in the absence of radiation, the high potential (shown having a positive sign) applied to the conductive layer 14 coupled with the matrix network (source and drain electrode lines) maintained at about ground potential, establishes an electric field across the panel 10 and, in particular, through the thick detector layer 16. The high potential is selected so that the electric field will be insufficient to turn on the transistors in the absence of radiation. As the panel is imaged by an irradiation source, such as by X-rays (indicated by arrow A) the semiconductor detector layer 16 becomes conductive by the excitation of electron/hole pairs therein. The charge carriers move through the semiconductor detector layer under the influence of the electric field, collapsing the field across the detector and establishing a much higher localized electric field across the dielectric layer 20. As indicated in FIG. 1, holes will be collected at the nitride/detector interface and electrons will be collected at the conductive layer 14. The holes at the interface will not migrate laterally because the detector material is a poor conductor in the non-irradiated areas. After imaging, the switch 38 is opened and the image information remains stored as positive charges at the nitride/detector interface, which may be viewed as a floating gate because it is not electrically connected to a potential source.

The floating gate potential in turn induces a negative charge, by means of electron accumulation, across the semiconductor channel 22 (as shown) thus turning ON the transistor. When a single pixel is irradiated (arrow B) the gate will extend from a single source electrode segment to the drain electrode line, whereas when two horizontally adjacent pixels are irradiated (arrow A), including a common source electrode line, the gate will extend from one source electrode segment to the other.

Information readout is accomplished conventionally in a line-by-line manner, by sequentially addressing each source electrode line with the application thereto of a drive voltage (on the order of 10 volts) and simultaneously reading out the currents from all the drain electrode lines. As each source line is addressed (for example source line b), the irradiated pixel locations, having gate voltages thereon, will have active transistors and current will flow from a single source electrode segment or two adjacent source electrode segments to and along the appropriate drain electrode line to the readout electronics. Since the current that flows through the transistor is a very sensitive function of the gate voltage, amplified analog signals proportional to the irradiation energy, will be transmitted to a suitable memory device and information processor.

After the entire array has been read out, holes will still remain at the nitride/detector interface and will be necessary to remove them in order to reuse the panel. This occurs spontaneously over time because once the voltage on the conductive layer has been switched off, the separated electrons and holes across the thick detector layer will induce a field in the opposite direction and will seek to recombine. The time involved will depend upon the conductivity of the detector layer and its thickness. For an amorphous silicon detector layer about 20 μm thick this would occur in a few seconds. However, the interface charge may be removed more rapidly by reversing the polarity of the high voltage source connected to the conductive layer and simultaneously flooding the entire panel with radiation which penetrates the photoconductor.

Figure 3:
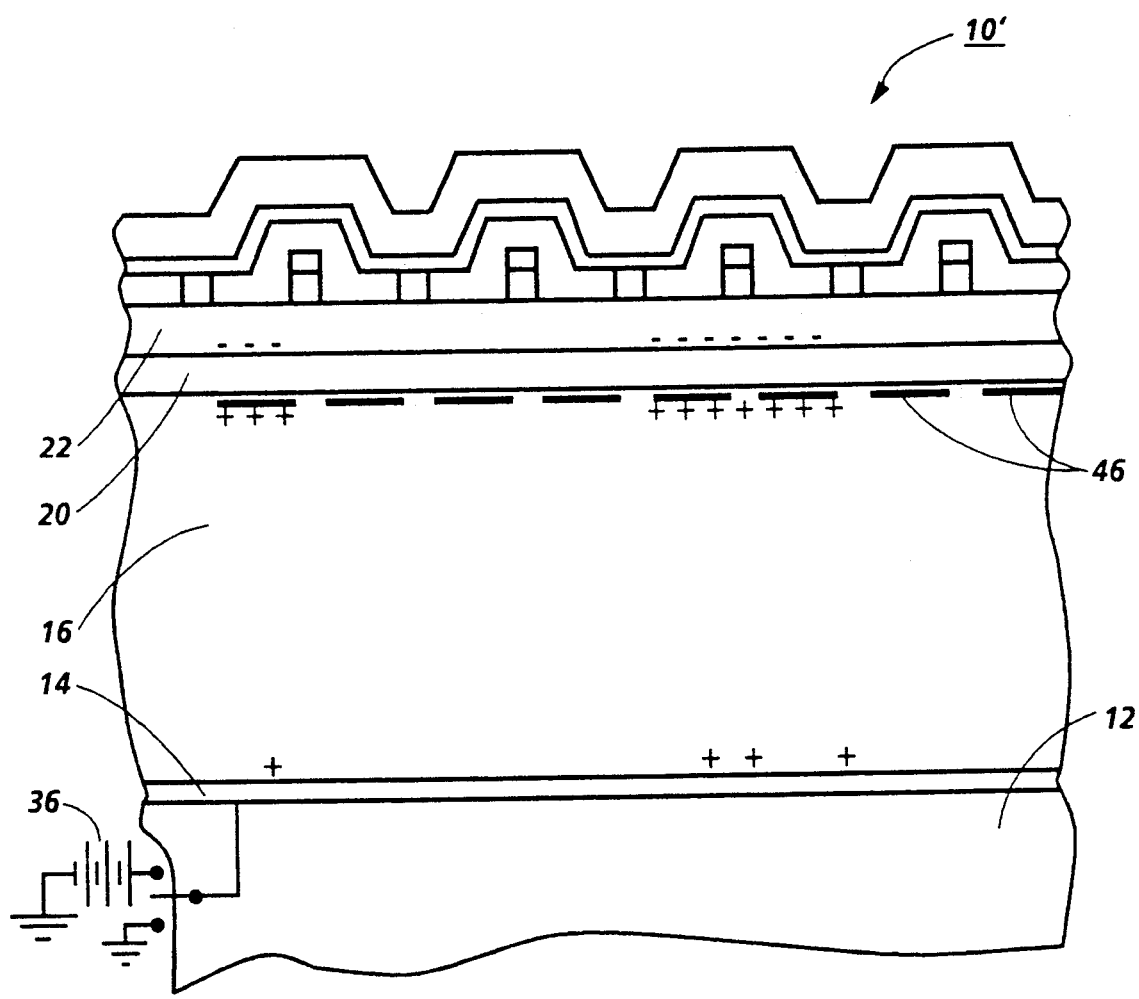
FIG. 3 is a side sectional view, similar to that of FIG. 1, showing a modified form of the image sensor array including metal gate electrodes.
Figure 4:
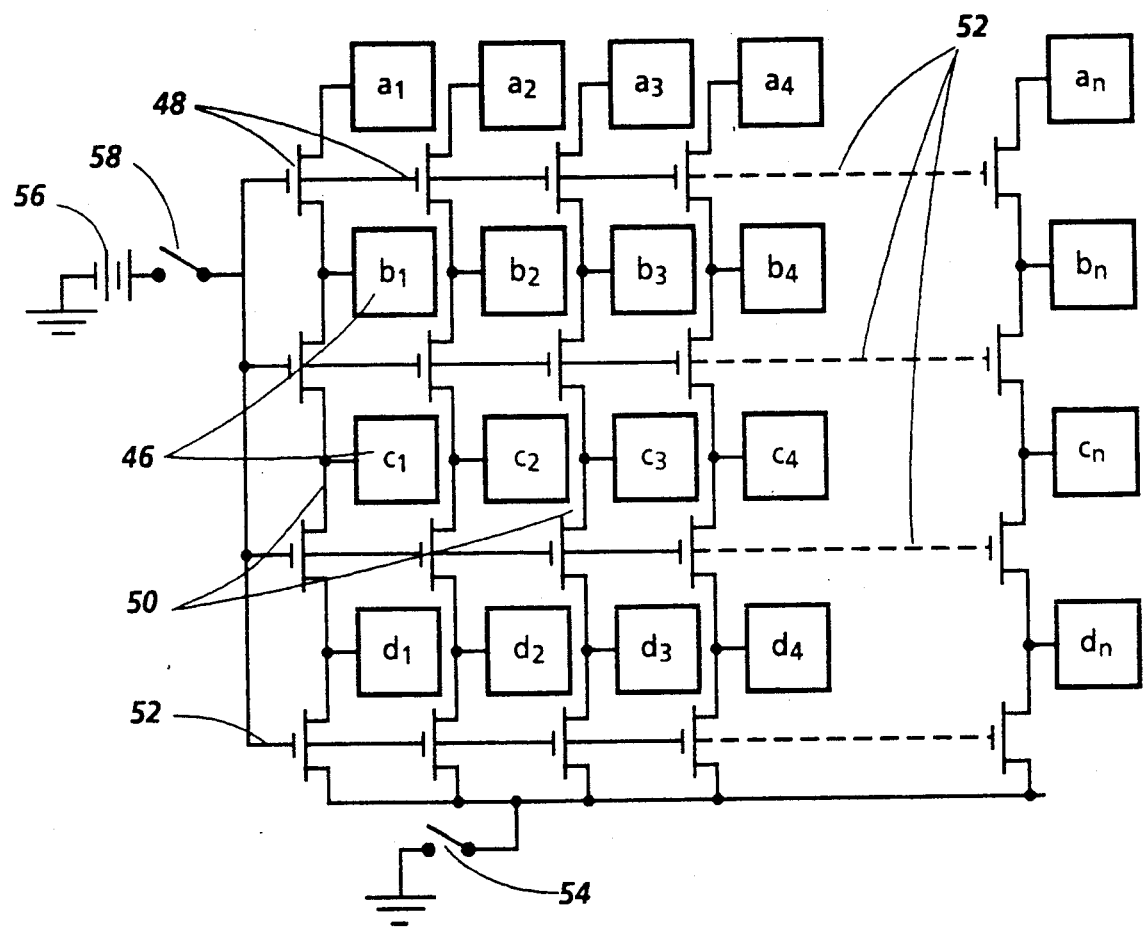
FIG. 4 is a schematic top plan view showing a gate electrode discharge network.

In FIGS. 3 and 4 there is illustrated a modified form of our detector panel wherein metal gate pads 46 are provided at each pixel location for holding the charge thereon. Additionally, a rapid charge dissipation circuit is shown in FIG. 4. These gate pads 46 and the charge dissipation circuit which includes pass transistors 48, discharge lines 50 and addressing lines 52 would be deposited between the detector layer 16 and the dielectric layer 20. The discharge lines are selectively coupled to ground via switch 54 and the addressing lines are selectively connected to a low potential source 56 (on the order of 5 volts) sufficient to turn all the pass transistors ON, via a switch 58. After imaging has been completed (with switch 54 open), both switches 54 and 58 are closed, resulting in all the pass transistors 48 being turned ON, and allowing the charge upon the gate pads to pass to ground.

A constraint upon the thick detector material 16 is that it must withstand the temperature of the TFT fabrication, which for amorphous silicon is about 350° C. If the detector material cannot withstand such a temperature, then an alternative embodiment of the panel would be an inverted structure wherein the patterned transistors layers are initially deposited upon the substrate and the thick detector layer is deposited thereon.

In addition to the direct detection of radiation intensity afforded by our invention, it has another advantage over fluorescent screen devices in that there is virtually no spreading of image details. When a phosphor layer is employed as a fluoroscope screen it emits light isotropically so that a cone of light emanates from each irradiated region. This result in intrinsic blurring because the minimum lateral resolution of a spot is comparable to the thickness of the phosphor layer. Since the sensitivity of the phosphor layer is proportional to its thickness a balance must be struck between sensitivity of the device and resolution. One method of overcoming this effect has been the fabrication of collimation structures upon or within the phosphor layer to constrain the light, but such devices are more expensive to produce.

By comparison, in the present invention the gate charge (in FIG. 1) is field constrained and virtually does not spread regardless of the detector layer thickness. Lateral diffusion of excited carriers at room temperature is given by the expression:

$$\left| \frac{KT}{e} \cdot \frac{d}{E} \right|^{\frac{1}{2}} = \left| \frac{d}{40E} \right|^{\frac{1}{2}}$$

where K is Boltzmann's constant, T is the temperature, e is the electronic charge, d is the detector layer thickness and E is the electric field, and the expression KT/e at room temperature is about 1/40. For a thickness of 100 μm and high voltage potential of 100 volts, the field would be 1 volt/μm, or 10,000 volts/cm, resulting in a lateral diffusion of less than 2 microns. The equivalent lateral diffusion distance in a fluorescent screen would be about 100 microns.

Another advantage of our invention is its simiplicity of use in the important "substraction" diagnostic technique for enhancing a digitally represented image. Two images are taken, separated by the introduction of a radiopaque contrast enhancing agent into the patient (such a the ingestion of a barium containing fluid), in order to highlight affected regions relative to an interfering background. In conventional techniques, the two discrete images may be compared, or representative data from each image is stored, manipulated and compared. With the present invention we are able to obtain a direct differential (subtractive) output. This may be accomplished merely by imaging the subject a first time with one polarity of the high potential source applied to the conductive layer 14, and then reimaging the subject at the opposite polarity of the high potential source. The resultant gate potential, either with or without the metal gate pads 46, automatically will represent the subtractive image and the transistors will pass that current information directly to the readout circuit.

In the art of xeroradiography a selenium plate is exposed to X-rays which have passed through an object. The selenium plate is typically comprised of about 150 μm of vacuum deposited amorphous selenium on an aluminum substrate (about 10 inches × 10 inches), overcoated with a thin protective polymer layer. It is usually charged to a surface potential of about 1500 volts, establishing a field thereacross. After X-ray exposure the field collapses in the irradiated areas to form an electrostatic latent image on the plate which is subsequently made visible by being toned. A logical application for the present invention would thus be to provide electronic readout of such plates and storage of the information. This would represent a significant advance in the art of radiography. By depositing adjacent to the selenium plate a multi-layer matrix array of thin film transistors, comparable to that designated as 18 in FIG. 1, coupled to readout electronics, a gray scale image is readily obtainable, as set forth above.

In another form of our invention, which relies upon the detector layer developing a voltage across it in response to suitable excitation energy, the detector layer may be made of a piezoelectric material, which will develop a voltage across it when strained. If the detector layer is excited with an ultrasound image, its strained areas would develop an AC charge on the transistor gate areas which would address the transistor matrix array to generate DC signals responsive thereto because the transistors only switch ON in response to a single polarity. It should be noted that since the AC charge results in no net charge being stored on the gate areas, it is only possible to obtain a readout of image information while the input image is being maintained.

Figure 5:
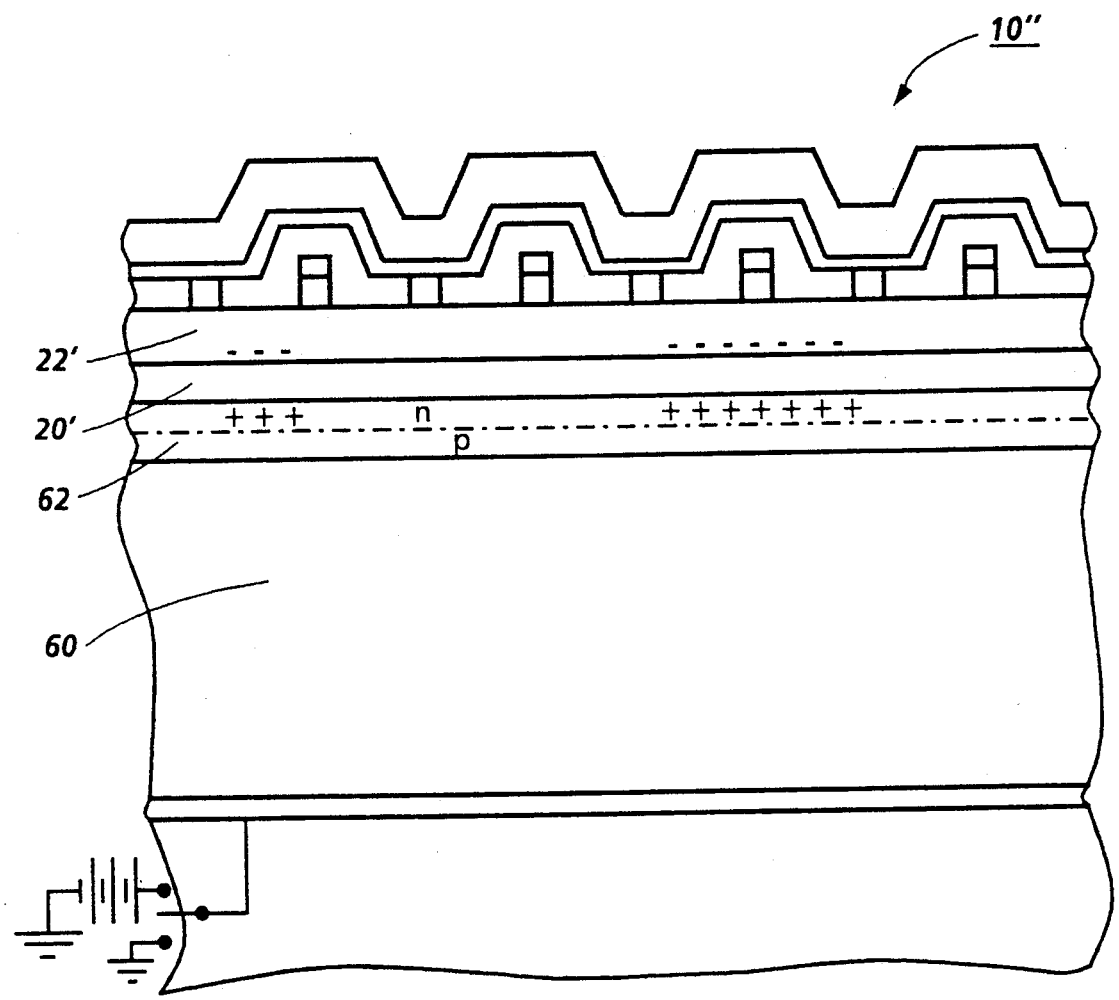
FIG. 5 is a side sectional view, similar to that of FIG. 1, showing a modified form of a sensor array including a piezoelectric detector and charge storage means.

In FIG. 5, there is illustrated an alternative form of a sensor array panel 10' which incorporates a piezoelectric layer 60. A rectifying layer 62, such as made from doped amorphous silicon layers, for example p-n, p-i or n-i (p-n shown), is placed between the piezolelectic layer 60 and the dielectric layer 20', charge storage would occur and the imaging information would be held after the input was removed.

It should be understood that the present disclosure has been made only by way of example, and that numerous changes in details of construction and the combination and arrangement of parts may be resorted to without departing from the true spirit and scope of the invention as hereinafter claimed.

What is claimed:

1. A solid state radiation sensor array panel comprising
   a generally planar thick deposited radiation detector layer capable of generating electron-hole pairs in response to being irradiated,
   a generally planar matrix array of source and drain electrode element disposed over said detector layer,
   a generally planar non-single crystal semiconductor charge transport layer located adjacent to said matrix array,
   a dielectric layer separating said detector layer and said charge transport layer,
   biasing means for establishing an electric field across said detector layer and for forming gate means in said detector layer relative to said source and drain electrode elements when said electric field collapses in irradiated areas for permitting current flow between said source and drain electrode means through said charge transport layer in areas corresponding to said irradiated areas, and
   means for reading out currents passing between source and drain electrodes in said matrix array.

2. The solid state radiation sensor array panel as defined in claim 1 wherein the cumulative thickness of said matrix array, said charge transport layer and said dielectric layer is at least ten times thinner than the thickness of said detector layer.

3. The solid state radiation sensor array panel as defined in claim 1 comprising orthogonally disposed source and drain lines and said means for reading out comprises means for sequentially energizing said source lines and for detecting, a line at a time, currents flowing on said drain lines.

4. The solid state radiation sensor array panel as defined in claim 1 wherein said biasing means for establishing an electric field comprises a planar conductive layer disposed over the surface of said detector layer remote from said dielectric layer, and means for connecting said conductive layer to a potential source.

5. The solid state radiation sensor array panel as defined in claim 1 comprising orthogonally disposed source and drain lines and said source electrode elements are connected to and disposed normal to said source lines and are parallel to said drain lines.

6. The solid state radiation sensor array panel as defined in claim 5 wherein each of said drain lines is disposed between two adjacent ones of said source electrode elements, whereby a current path may extend from a single source electrode element to an adjacent drain line or from two source electrode elements to said drain line disposed therebetween.

7. The solid state radiation sensor array panel as defined in claim 1 further including an array of conductive gate pads, with one pad associated with each source and drain electrode element.

8. The solid state radiation sensor array panel as defined in claim 7 further including a source of reference potential and a conductive path connecting said gate pads to said source of reference potential.

9. The solid state radiation sensor array panel as defined in claim 1 wherein said detector layer comprises a photoconductive a material.

10. The solid state radiation sensor array panel as defined in claim 9 wherein said photoconductive material comprises amorphous silicon.

11. The solid state radiation sensor array panel as defined in claim 9 wherein said photoconductive material comprises a chalcogenide glass.

12. The solid state radiation sensor array panel as defined in claim 11 wherein said chalcogenide glass is amorphous selenium.

13. The solid state radiation sensor array panel as defined in claim 11 wherein said chalcogenide glass is arsenic selenide.

14. The solid state radiation sensor array panel as defined in claim 9 wherein said photoconductive material comprises zinc sulfide.

15. The solid state radiation sensor array panel as defined in claim 9 wherein said photoconductive material is an organic material.

16. The solid state radiation sensor array panel as defined in claim 1 wherein said detector layer comprises a piezoelectric material.

17. The solid state radiation sensor array panel as defined in claim 16 further including a rectifying layer separating said dielectric layer from said piezoelectric layer for allowing said panel to store charge thereon representative of transient images.

* * * * *